United States Patent
Wang

(10) Patent No.: US 11,968,875 B2
(45) Date of Patent: Apr. 23, 2024

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Kan Wang, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 619 days.

(21) Appl. No.: 17/263,462

(22) PCT Filed: Sep. 7, 2020

(86) PCT No.: PCT/CN2020/113776
§ 371 (c)(1),
(2) Date: Jan. 26, 2021

(87) PCT Pub. No.: WO2022/036768
PCT Pub. Date: Feb. 24, 2022

(65) Prior Publication Data
US 2023/0140663 A1 May 4, 2023

(30) Foreign Application Priority Data
Aug. 20, 2020 (CN) .......................... 202010841522.X

(51) Int. Cl.
*H10K 59/38* (2023.01)
*H10K 50/844* (2023.01)

(52) U.S. Cl.
CPC ........... *H10K 59/38* (2023.02); *H10K 50/844* (2023.02)

(58) Field of Classification Search
CPC ............................. H10K 59/38; H10K 50/844
See application file for complete search history.

(56) References Cited

U.S. PATENT DOCUMENTS

| | | | |
|---|---|---|---|
| 11,716,888 B2 * | 8/2023 | Tang .................... | H10K 59/353 257/40 |
| 2006/0121254 A1 * | 6/2006 | Toyoda ................ | H10K 71/135 427/532 |

(Continued)

FOREIGN PATENT DOCUMENTS

| CN | 105514296 A | 4/2016 |
|---|---|---|
| CN | 107565053 A | 1/2018 |

(Continued)

OTHER PUBLICATIONS

International Search Report in International application No. PCT/CN2020/113776, dated Apr. 26, 2021.

(Continued)

*Primary Examiner* — Nathan W Ha
(74) *Attorney, Agent, or Firm* — PV IP PC; Wei Te Chung; Zhigang Ma

(57) ABSTRACT

The present application provides a display panel and a display device. The display panel includes an array substrate, a pixel definition layer, an organic light-emitting layer, a cathode layer, an encapsulation layer, and an absorption layer. The absorption layer is arranged on one side of the pixel definition layer away from the array substrate. The absorption layer is arranged corresponding to at least a portion of the pixel definition layer in a curved display region for selectively absorbing at least one color light, so as to reduce a risk of color shift in a white screen at large viewing angles without causing color shift of images at a vertical viewing angle.

18 Claims, 3 Drawing Sheets

(56) References Cited

U.S. PATENT DOCUMENTS

| | | | |
|---|---|---|---|
| 2007/0108899 A1* | 5/2007 | Jung | H10K 59/805 313/506 |
| 2010/0026178 A1* | 2/2010 | Hwang | H10K 50/816 313/506 |
| 2011/0042697 A1* | 2/2011 | Lee | H10K 50/854 257/89 |
| 2014/0175399 A1* | 6/2014 | Choi | H10K 71/00 257/40 |
| 2014/0346452 A1* | 11/2014 | You | H10K 59/38 257/40 |
| 2015/0115217 A1* | 4/2015 | Cho | H10K 50/11 257/40 |
| 2015/0380466 A1* | 12/2015 | Koo | H10K 50/858 438/70 |
| 2016/0025302 A1* | 1/2016 | Shiratori | H10K 59/38 362/231 |
| 2016/0226029 A1* | 8/2016 | Lee | H10K 50/858 |
| 2017/0062770 A1* | 3/2017 | Jang | H10K 59/124 |
| 2018/0095570 A1* | 4/2018 | Hong | G06F 3/0412 |
| 2018/0166656 A1* | 6/2018 | Langguth | H10K 59/38 |
| 2019/0067383 A1* | 2/2019 | Jo | H10K 59/38 |
| 2019/0181189 A1 | 6/2019 | Chang et al. | |
| 2019/0237523 A1* | 8/2019 | Zhai | H10K 59/122 |
| 2020/0006450 A1* | 1/2020 | Ma | H10K 50/85 |
| 2020/0058709 A1* | 2/2020 | Lee | H10K 50/11 |
| 2020/0135810 A1* | 4/2020 | Lee | H10K 59/126 |
| 2020/0152704 A1* | 5/2020 | Jang | H10K 59/1201 |
| 2020/0266392 A1* | 8/2020 | Lee | G06F 3/0412 |
| 2021/0014982 A1* | 1/2021 | Bok | H05K 1/189 |
| 2021/0074769 A1* | 3/2021 | Park | H01L 33/504 |
| 2021/0074939 A1* | 3/2021 | Jung | H10K 59/38 |
| 2021/0104589 A1* | 4/2021 | Shin | H10K 50/858 |
| 2021/0175468 A1* | 6/2021 | Lee | H10K 50/844 |
| 2021/0183971 A1* | 6/2021 | Kim | H10K 50/844 |
| 2021/0184160 A1* | 6/2021 | Li | H10K 50/84 |
| 2021/0193741 A1* | 6/2021 | Chen | H10K 50/84 |
| 2021/0202586 A1* | 7/2021 | Yang | H10K 59/38 |
| 2021/0202651 A1* | 7/2021 | Im | H10K 59/122 |
| 2021/0335942 A1* | 10/2021 | Wang | H10K 71/50 |
| 2021/0335943 A1* | 10/2021 | Song | H10K 59/122 |
| 2021/0343986 A1* | 11/2021 | Zheng | H10K 59/12 |
| 2023/0247848 A1* | 8/2023 | Ryohwa | H05B 33/12 257/40 |

FOREIGN PATENT DOCUMENTS

| | | |
|---|---|---|
| CN | 108022952 A | 5/2018 |
| CN | 109742112 A | 5/2019 |
| CN | 110047890 A | 7/2019 |

OTHER PUBLICATIONS

Written Opinion of the International Search Authority in International application No. PCT/CN2020/113776, dated Apr. 26, 2021.
Chinese Office Action issued in corresponding Chinese Patent Application No. 202010841522.X dated May 17, 2021, pp. 1-7.

* cited by examiner

DISPLAY PANEL AND DISPLAY DEVICE

RELATED APPLICATIONS

This application is a Notional Phase of PCT Patent Application No. PCT/CN2020/113776 having international filing date of Sep. 7, 2020, which claims the benefit of priority of Chinese Patent Application No. 202010841522.X filed on Aug. 20, 2020. The contents of the above applications are all incorporated by reference as if fully set forth herein in their entirety.

FIELD OF DISCLOSURE

The present invention relates to a field of display technology and in particular, to a display panel and a display device.

DESCRIPTION OF RELATED ART

Organic light-emitting diode (OLED) displays are self-luminous display devices, because they can use organic light-emitting materials to self-luminate under an applied voltage, without a need for an additional backlight. Therefore, the OLED displays have advantages such as being light and thin. In addition, because organic materials are flexible and easy to bend, the OLED displays can be made into flexible and foldable displays. Therefore, the OLED displays are more extensively used in the display field.

At present, due to the flexible and easy bending characteristics of OLED displays, manufacturers have launched many products such as "curved screens", "surround screens", and "waterfall screens" to further increase a screen ratio and enhance display effects. However, the "surround screen" and "waterfall screen" are bent a large angle at left and right ends of a display, so that when viewing an image vertically with respect to the display, due to the large viewing angle, displayed images in curved display regions at the left and right ends of the display inevitably have color shift problems such as "green edges" and other undesirable color shift problems known on the market.

In summary, it is necessary to provide a new display panel and a display device to solve the above technical problems.

SUMMARY

The display panel and the display device provided by the present invention solve a problem of conventional display panels and display devices. The problem is that, different color lights emitted by an organic light-emitting layer have different changes in brightness and chromaticity at different viewing angles, so images displayed at a bent portion of the display panel easily have larger color shifts at large viewing angles.

To solve the above problem, the present invention provides a technical solution as follows.

The present invention provides a display panel, comprising a flat display region and a curved display region located on at least one side of the flat display region, wherein the display panel further comprises:
an array substrate;
a pixel definition layer disposed on the array substrate, wherein the pixel definition layer defines a plurality of pixel definition openings;
an organic light-emitting layer disposed in the pixel definition opening and configured to emit various color lights;
a cathode layer disposed on the pixel definition layer and the organic light-emitting layer;
an encapsulation layer disposed on the cathode layer; and
an absorption layer disposed on one side of the pixel definition layer away from the array substrate, wherein the absorption layer comprises a red light absorber coating, a green light absorber coating, or a blue light absorber coating, the absorption layer is disposed corresponding to at least a portion of the pixel definition layer in the curved display region for selectively absorbing at least one color light emitted by the organic light emitting layer disposed in the curved display region.

In the display panel according to one embodiment of the present invention, the absorption layer is disposed between the pixel-definition layer and the cathode layer.

In the display panel according to one embodiment of the present invention, the absorption layer is disposed between the cathode layer and the encapsulation layer.

In the display panel according to one embodiment of the present invention, the absorption layer is disposed on the encapsulation layer.

In the display panel according to one embodiment of the present invention, the encapsulation layer comprises a first inorganic encapsulation layer, an organic encapsulation layer, and a second inorganic encapsulation layer sequentially stacked on the cathode layer, and the absorption layer is disposed inside the encapsulation layer.

In the display panel according to one embodiment of the present invention, a thickness of the first inorganic encapsulation layer and a thickness of the second inorganic encapsulation layer range from 1 nm to 10 µm, and a thickness of the organic encapsulation layer ranges from 10 nm to 20 µm.

In the display panel according to one embodiment of the present invention, the plurality of color lights emitted by the organic light-emitting layer at least comprise a first color light, a second color light, and a third color light; in a vertical viewing angle, a brightness ratio of the first color light in the flat display region to the first color light in the curved display region is greater than a brightness ratio of the second color light in the flat display region to the second color light in the curved display region, and the brightness ratio of the second color light in the flat display region to the second color light in the curved display region is equal to a brightness ratio of the third color light in the flat display region to the third color light in the curved display region; and the absorption layer absorbs at least a portion of the first color light.

In the display panel according to one embodiment of the present invention, the first color light, the second color light, and the third color light are red light, green light, and blue light in any sequence; and the first color light, the second color light, and the third color light are different colors.

In the display panel according to one embodiment of the present invention, the curved display regions are located at opposite two sides of the flat display region, and each of the curved display regions is bent in a direction away from a display direction of the display panel.

In the display panel according to one embodiment of the present invention, a thickness of the absorption layer ranges from 0.01 µm to 10 µm.

The present invention provides a display panel comprising a flat display region and a curved display region located on at least one side of the flat display region, wherein the display panel further comprises:
an array substrate;

a pixel definition layer disposed on the array substrate, wherein the pixel definition layer defines a plurality of pixel definition openings;

an organic light-emitting layer disposed in the pixel definition opening and configured to emit various color lights;

a cathode layer disposed on the pixel definition layer and the organic light-emitting layer;

an encapsulation layer disposed on the cathode layer; and an absorption layer disposed on one side of the pixel definition layer away from the array substrate, wherein the absorption layer is disposed corresponding to at least a portion of the pixel definition layer in the curved display region for selectively absorbing at least one color light emitted by the organic light emitting layer disposed in the curved display region.

In the display panel according to one embodiment of the present invention, the absorption layer is disposed between the pixel definition layer and the cathode layer.

In the display panel according to one embodiment of the present invention, the absorption layer is disposed between the cathode layer and the encapsulation layer.

In the display panel according to one embodiment of the present invention, the absorption layer is disposed on the encapsulation layer.

In the display panel according to one embodiment of the present invention, the encapsulation layer comprises a first inorganic encapsulation layer, an organic encapsulation layer, and a second inorganic encapsulation layer sequentially stacked on the cathode layer, and the absorption layer is disposed inside the encapsulation layer.

In the display panel according to one embodiment of the present invention, the absorption layer is arranged between the first inorganic encapsulation layer and the organic encapsulation layer.

In the display panel according to one embodiment of the present invention, the absorption layer is arranged between the organic encapsulation layer and the second inorganic encapsulation layer.

In the display panel according to one embodiment of the present invention, the plurality of color lights emitted by the organic light emitting layer at least comprise a first color light, a second color light, and a third color light; in a vertical viewing angle, a brightness ratio of the first color light in the flat display region to the first color light in the curved display region is greater than a brightness ratio of the second color light in the flat display region to the second color light in the curved display region, and the brightness ratio of the second color light in the flat display region to the second color light in the curved display region is equal to a brightness ratio of the third color light in the flat display region to the third color light in the curved display region; and the absorption layer absorbs at least a portion of the first color light.

In the display panel according to one embodiment of the present invention, the first color light, the second color light, and the third color light are red light, green light, and blue light in any sequence; and the first color light, the second color light, and the third color light are different colors.

The present invention provides a display device which comprises the display panel mentioned above.

In the display panel and the display device of the present invention, by providing the absorption layer corresponding to at least a portion of the pixel definition layer located in the curved display region, at least one color light emitted by the organic light-emitting layer located in the curved display region is selectively absorbed, so as to adjust the brightness ratios of the various color lights emitted by the organic light-emitting layer at large viewing angles, and reduce the risk of color shift in a white screen at large viewing angles. At the same time, the absorption layer has no absorption and interference effects on the light emitted in a forward (vertical) direction by the organic light-emitting layer at the vertical viewing angle, so that this configuration does not cause color shift of images at a vertical viewing angle, and the display performance of the display panel is improved.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

Figure 1:
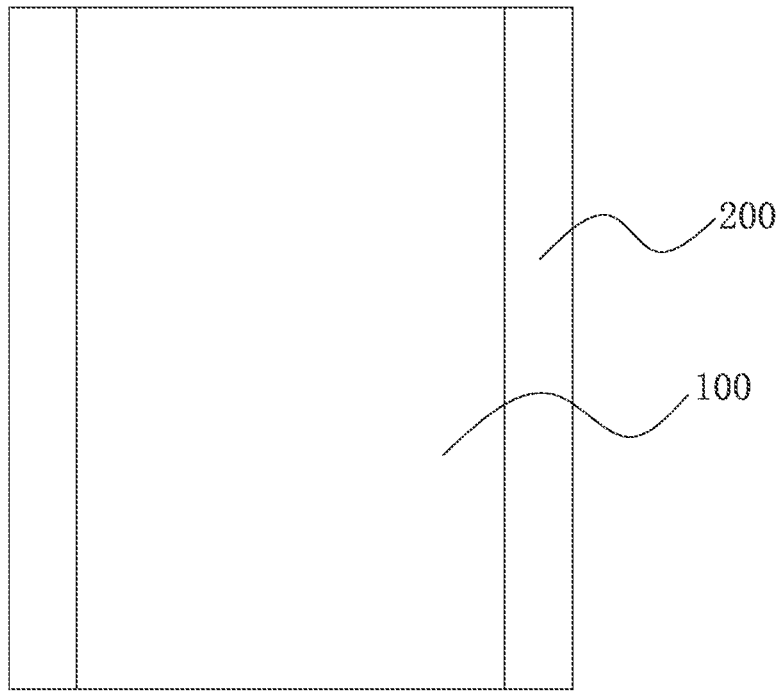
FIG. 1 is a schematic plan view illustrating a display panel according to one embodiment of the present application.

A description is provided below with reference to the accompanying drawings to illustrate specific embodiments of the present invention. The directional terms mentioned in the present invention, such as "upper", "lower", "front", "rear", "left", "right", "inner", "outer", and "lateral", are for illustrative purposes based on the accompanying drawings. Therefore, the directional terms are only used to describe and understand the present invention, rather than to limit the present invention. In the drawings, structurally similar elements are indicated by the same reference numerals.

The present invention is directed to solving a problem of conventional display panels and display devices. The problem is that, different color lights emitted by an organic light-emitting layer have different changes in brightness and chromaticity at different viewing angles, so images displayed in a bent portion of the display panel easily have larger color shifts at large viewing angles. The present invention can solve this defect.

Figure 2:
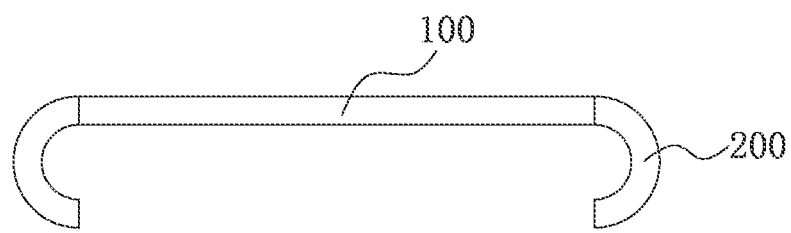
FIG. 2 is a schematic cross-sectional view illustrating the display panel according to one embodiment of the present invention.

Please refer to FIGS. 1 and 2, showing a display panel according to one embodiment of the present invention. The display panel comprises a flat display region 100 and a curved display region 200 located on at least one side of the flat display region 100. The present embodiment does not limit a positional relationship between the flat display region 100 and the curved display region 200. The curved display region 200 can be arranged on one or more sides of the flat display region 100, so as to form, for example, a "curved screen" or a "waterfall screen". The curved display region 200 can also surround the flat display region 100, so as to form, for example, a "surround screen". In the display panel shown in FIGS. 1 and 2, the curved display regions 200 are located at opposite two sides of the flat display region 100. The curved display region 200 is bent away from a display direction of the display panel.

Please refer to FIGS. 3, 4, 5, 6, and 7, the display panel comprises an array substrate 10, a pixel definition layer 20, an organic light-emitting layer 30, a cathode layer 50, an encapsulation layer 60, and an absorption layer 40. The pixel definition layer 20 is disposed on the array substrate 10, and the pixel definition layer 20 defines a plurality of pixel definition openings 201. The organic light-emitting layer 30 is disposed in the pixel definition openings 201, and the organic light-emitting layer 30 is used to emit various color lights. The cathode layer 50 is disposed on the pixel definition layer 20 and the organic light-emitting layer 30, and the encapsulation layer 60 is disposed on the cathode layer 50 to prevent water and oxygen from entering the organic light-emitting layer 30 from outside. It should be noted that an anode layer (not illustrated in the drawings) is disposed on the array substrate 10, and the anode layer and the organic light-emitting layer 30 are arranged corresponding to each other.

Specifically, the various color lights emitted by the organic light-emitting layer 30 comprise at least a first color light, a second color light, and a third color light, wherein the first color light, the second color light, and the third color light are red light, green light, and blue light in any sequence, and the first color light, the second color light, and the third color light are of different colors.

It should be noted that when the user views a displayed image of the display panel from a vertical viewing angle, that is, at a large viewing angle, the flat display region 100 displays a white screen since the red light, the green light, and the blue light emitted by the organic light-emitting layer 30 located in the flat display region 100 have a preset brightness ratio. However, an actual outgoing light path of the light from the curved display region 200 is longer than an actual outgoing light path of the light from the flat display region 100, and as a result, brightness ratios of the red light, the green light, and the blue light emitted by the organic light-emitting layer 30 in the curved display region 200 and the curved display region 200 are different. Therefore, a color shift problem is caused in the curved display area 200 at a large viewing angle. For example, in comparison, when the red light has a relatively high brightness, the curved display region 200 has a red color shift; when the green light has a relatively high brightness, the curved display region 200 has a green color shift; when the blue light has a relatively high brightness, the curved display region 200 has a blue color shift. It should be noted that what color shift the curved display region 200 displays depends on the brightness and chromaticity of the red light, green light, and blue light at different viewing angles. The more common one is green color shift. The reason is that brightness attenuation of the red light in relation to viewing angles is usually greater than that of the green light in relation to viewing angles.

In terms of working principles, in a vertical viewing angle, when a brightness ratio of the first color light in the flat display region 100 to the first color light in the curved display region 200 is greater than a brightness ratio of the second color light in the flat display region 100 to the second color light in the curved display region 200, and the brightness ratio of the second color light in the flat display region 100 to the second color light in the curved display region 200 is equal to a brightness ratio of the third color light in the flat display region 100 to the third color light in the curved display region 200, then the absorption layer 40 absorbs at least a portion of the first color light, so that the first color light, the second color light, and the third color light emitted by the organic light-emitting layer 30 in the curved display region 200 and the flat display region 100 have the same brightness ratio. In other words, the red light, the green light, and the blue light emitted by the organic light-emitting layer 30 in the curved display region 200 and the flat display region 100 have the same brightness ratio. This way, the brightness ratios of the various color lights emitted by the organic light-emitting layer 30 at large viewing angles can be adjusted, and the risk of color shift in a white screen at a large viewing angle can be reduced.

Structurally, the absorption layer 40 is disposed on one side of the pixel definition layer 20 away from the array substrate 10. The absorption layer 40 is arranged corresponding to at least a portion of the pixel definition layer 20 in the curved display region 200, and configured to selectively absorb at least one color light emitted by the organic light-emitting layer 30 located in the curved display region 200. Specifically, the absorption layer 40 can be made of a red light absorber coating or a green light absorber coating, or a blue light absorber coating which has high performance on selective absorption of red light, green light and blue light respectively. For example, when the curved display region 200 has a red color shift, the absorption layer 40 adopts a red light absorber coating, and material of the absorption layer 40 can include cadmium telluride; when the curved display region 200 has a green color shift, the absorption layer 40 adopts a green light absorber coating, and material of the absorption layer 40 can include dipyrrolborane; when the curved display region 200 has a blue color shift, the absorption layer 40 adopts a blue absorber coating, and material of the absorption layer 40 can include lotsorb absorber B-800 (2 mm, PC) or other suitable absorber paint.

It should be noted that the absorption layer 40 can be arranged corresponding to only a portion of the pixel definition layer 20 in the curved display region 200, or can be arranged corresponding to all of the pixel definition layer 20 in the curved display area 200, as long as the absorption layer 40 does not overlap the organic light-emitting layer 30 in the curved display region 200 in a vertical direction. Under this condition, the absorption layer 40 has no absorption or interference effects on the outgoing light emitted in a forward direction by the organic light-emitting layer 30 at a vertical viewing angle, so the absorption layer 40 does not cause color shift of images at the vertical viewing angle.

Figure 3:
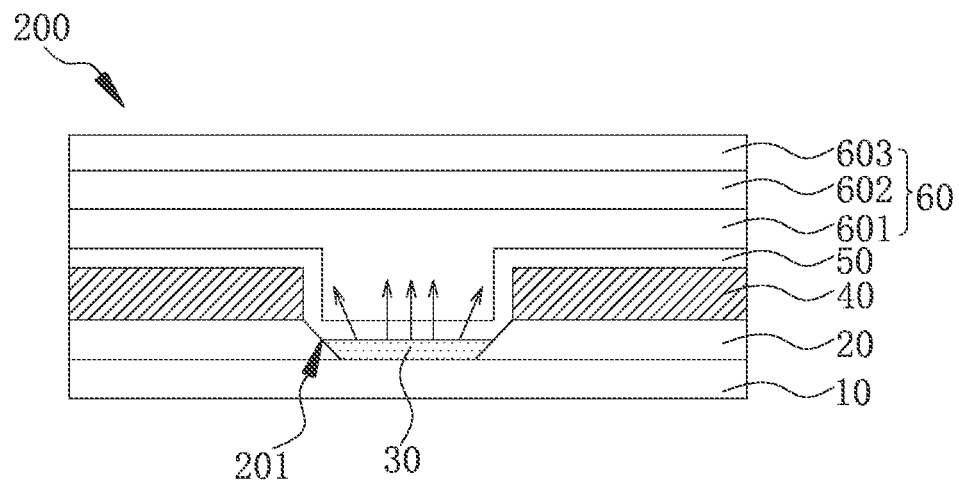
FIG. 3 is a schematic cross-sectional view illustrating a structure of the display panel in a curved display region according to a first embodiment of the present invention.

Referring to FIG. 3, in one embodiment, the absorption layer 40 is located between the pixel definition layer 20 and the cathode layer 50, and is arranged corresponding to at least a portion of the pixel definition layer 20 located in the curved display region 200. The absorption layer 40 is configured to absorb some oblique light, the cathode layer 50 covers the pixel definition layer 20, the organic light-emitting layer 30, and the absorption layer 40, and the encapsulation layer 60 covers the cathode layer 50. The present embodiment does not limit a specific structure of the encapsulation layer 60.

Figure 4:
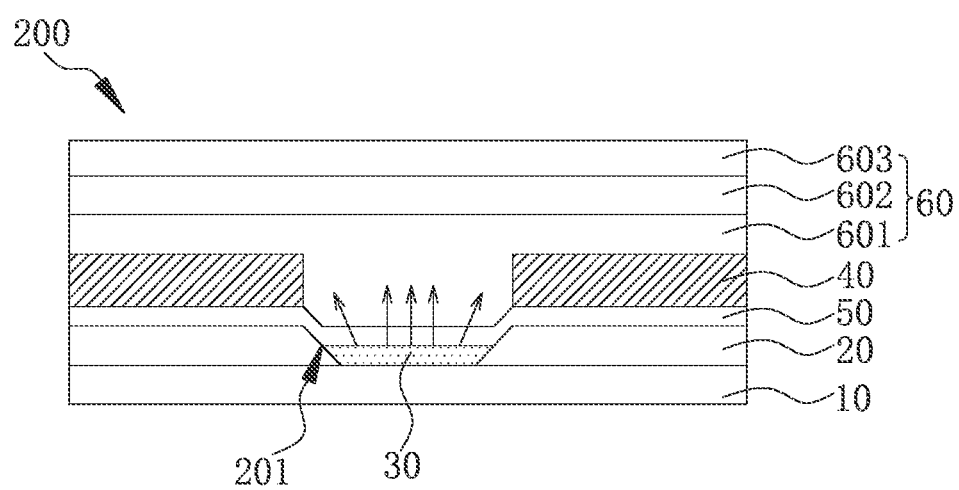
FIG. 4 is a schematic cross-sectional view illustrating the structure of the display panel in the curved display region according to a second embodiment of the present invention.

Referring to FIG. 4, in one embodiment, FIG. 4 is different from FIG. 3 in that, the absorption layer 40 is located between the cathode layer 50 and the encapsulation layer 60, and is arranged corresponding to at least a portion of the pixel definition layer 20 in the curved display region 200. The absorption layer 40 is arranged on the cathode layer 50, and the encapsulation layer 60 covers the cathode layer 50 and the absorption layer 40. Similarly, the present embodiment does not limit the specific structure of the encapsulation layer 60.

Figure 5:
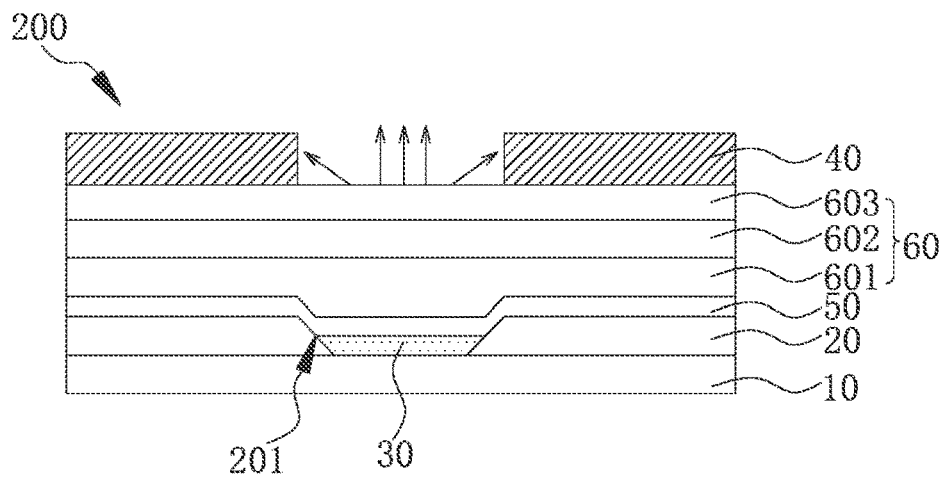
FIG. 5 is a schematic cross-sectional view illustrating the structure of the display panel in the curved display region according to a third embodiment of the present invention.

Referring to FIG. 5, in one embodiment, FIG. 5 is different from FIG. 3 in that, the absorption layer 40 is located on the encapsulation layer 60 and is arranged corresponding to at least a portion of the pixel definition layer 20 in the curved display region 200. The cathode layer 50 covers the pixel definition layer 20 and the organic light-emitting layer 30, and the encapsulation layer 60 covers the cathode layer 50. Similarly, the present embodiment does not limit the specific structure of the encapsulation layer 60.

Since both the cathode layer 50 and the encapsulation layer 60 are transparent, the light emitted by the organic light-emitting layer 30 located in the curved display region 200 can be transmitted through the encapsulation layer 60.

Figure 6:
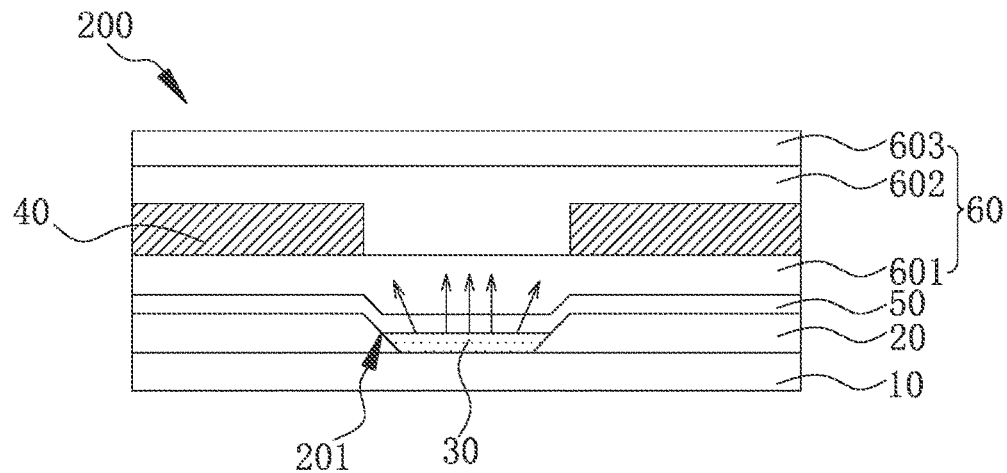
FIG. 6 is a schematic cross-sectional view illustrating the structure of the display panel in the curved display region according to a fourth embodiment of the present invention.
Figure 7:
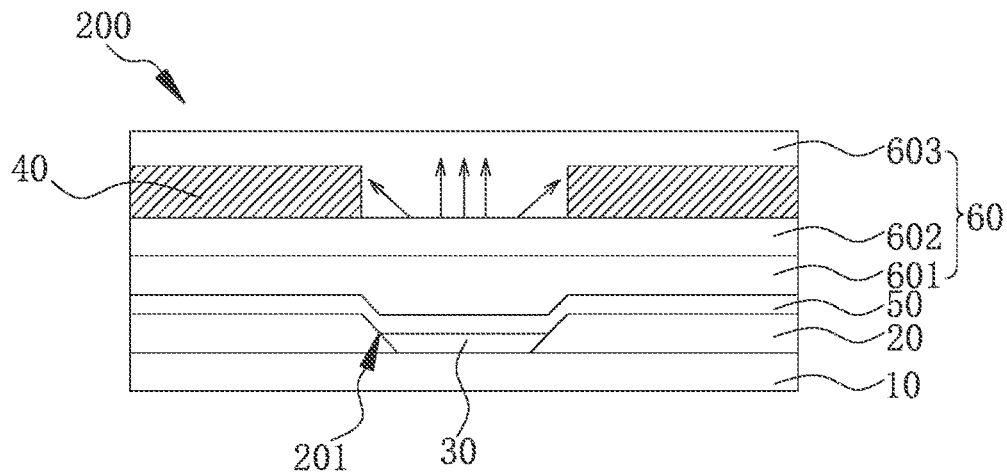
FIG. 7 is a schematic cross-sectional view illustrating the structure of the display panel in the curved display region according to a fifth embodiment of the present invention.

Further, referring to FIGS. 6 and 7, the encapsulation layer 60 includes a multi-layer encapsulation structure, and the encapsulation layer 60 includes a first inorganic encapsulation layer 601, an organic encapsulation layer 602, and a second inorganic encapsulation layer 603 that are sequentially stacked on the cathode layer 50. FIGS. 6 and 7 are different from FIGS. 3, 4 and 5 in that, the absorption layer 40 is located inside the encapsulation layer 60.

Specifically, referring to FIG. 6, in one embodiment, the absorption layer 40 is located between the first inorganic encapsulation layer 601 and the organic encapsulation layer 602, and the cathode layer 50 covers the pixel definition layer 20 and the organic light-emitting layer 30, the first inorganic encapsulation layer 601 is disposed on the cathode layer 50, and the absorption layer 40 is disposed on the first inorganic encapsulation layer 601 and is arranged corresponding to at least a portion of the pixel definition layer 20 in the curved display region 200. The organic encapsulation layer 602 covers the absorption layer 40 and the first inorganic encapsulation layer 601, and the second inorganic encapsulation layer 603 covers the organic encapsulation layer 602.

Specifically, referring to FIG. 7, in one embodiment, the absorption layer 40 is located between the organic encapsulation layer 602 and the second inorganic encapsulation layer 603, and the cathode layer 50 covers the pixel definition layer 20 and the organic light emitting layer 30, the first inorganic encapsulation layer 601 covers the cathode layer, the organic encapsulation layer 602 covers the first inorganic encapsulation layer 601, and the absorption layer 40 is disposed on the organic encapsulation layer and is arranged corresponding to at least a portion of the pixel definition layer 20 in the curved display region 200. The second inorganic encapsulation layer 603 covers the absorption layer 40 and the organic encapsulation layer 602.

Selectively, materials of the first inorganic encapsulation layer 601 and the second inorganic encapsulation layer 603 comprise SiNx, SiONx, and AlOx, and materials of the organic encapsulation layer 602 comprise acrylic organic polymers.

Specifically, thicknesses of the first inorganic encapsulation layer 601 and the second inorganic encapsulation layer 603 range from 1 nm to 10 μm, and a thickness of the organic encapsulation layer 602 ranges from 10 nm to 20 μm.

It should be noted that, in the embodiments shown in FIG. 6 and FIG. 7, the encapsulation layer 60 is a three-layer encapsulation structure, but the present invention is not limited in this regard. The encapsulation layer 60 can also be an encapsulation structure having five, seven, or more layers. There are more possibilities for the specific position of the absorption layer 40 as the structure of the encapsulation layer 60 may change. Such changes are within the protection scope of the present application, and a detailed description thereof is omitted herein.

Specifically, a thickness of the absorption layer 40 ranges from 0.01 μm to 10 μm.

The present invention also provides a display device. The display device comprises the above-mentioned display panel. The display device can be a mobile terminal, a tablet computer, a sports bracelet, a remote control, or an all-in-one computer. The display device has advantages of having small color shift at a large viewing angle, and a detailed description thereof is not repeated herein for brevity.

In the display panel and the display device of the present invention, by providing the absorption layer corresponding to at least a portion of the pixel definition layer located in the curved display region, at least one color light emitted by the organic light-emitting layer located in the curved display region is selectively absorbed, so as to adjust the brightness ratios of the various color lights emitted by the organic light-emitting layer at large viewing angles, and reduce the risk of color shift in the white screen at large viewing angles. At the same time, the absorption layer has no absorption and interference effects on the light emitted in a forward (vertical) direction by the organic light-emitting layer at the vertical viewing angle, so that this configuration does not cause color shift of the image at the vertical viewing angle, and the display performance of the display panel is improved.

In summary, although the present invention has been disclosed in preferable embodiments as above, the above-mentioned embodiments are not intended to limit the present invention. Persons of ordinary skill in the art can make various modifications and changes. Such changes and modifications are deemed to be within the protection scope of the present invention defined by the appended claims.

What is claimed is:

1. A display panel, comprising a flat display region and a curved display region located on at least one side of the flat display region, wherein the display panel further comprises:
   an array substrate;
   a pixel definition layer disposed on the array substrate, wherein the pixel definition layer defines a plurality of pixel definition openings;
   an organic light-emitting layer disposed in the pixel definition opening and configured to emit various color lights;
   a cathode layer disposed on the pixel definition layer and the organic light-emitting layer;
   an encapsulation layer disposed on the cathode layer; and
   an absorption layer disposed on one side of the pixel definition layer away from the array substrate, wherein the absorption layer comprises a red light absorber coating, a green light absorber coating, or a blue light absorber coating, the absorption layer is disposed corresponding to at least a portion of the pixel definition layer in the curved display region for selectively absorbing at least one color light emitted by the organic light emitting layer disposed in the curved display region,
   wherein the plurality of color lights emitted by the organic light-emitting layer at least comprise a first color light, a second color light, and a third color light; in a vertical viewing angle, a brightness ratio of the first color light in the flat display region to the first color light in the curved display region is greater than a brightness ratio of the second color light in the flat display region to the second color light in the curved display region, and the brightness ratio of the second color light in the flat display region to the second color light in the curved display region is equal to a brightness ratio of the third color light in the flat display region to the third color light in the curved display region; and the absorption layer absorbs at least a portion of the first color light.

2. The display panel according to claim 1, wherein the absorption layer is disposed between the pixel-definition layer and the cathode layer.

3. The display panel according to claim 1, wherein the absorption layer is disposed between the cathode layer and the encapsulation layer.

4. The display panel according to claim 1, wherein the absorption layer is disposed on the encapsulation layer.

5. The display panel according to claim 1, wherein the encapsulation layer comprises a first inorganic encapsulation layer, an organic encapsulation layer, and a second inorganic encapsulation layer sequentially stacked on the cathode layer, and the absorption layer is disposed inside the encapsulation layer.

6. The display panel according to claim 5, wherein a thickness of the first inorganic encapsulation layer and a thickness of the second inorganic encapsulation layer range from 1 nm to 10 μm, and a thickness of the organic encapsulation layer ranges from 10 nm to 20 μm.

7. The display panel according to claim 1, wherein the first color light, the second color light, and the third color light are red light, green light, and blue light in any sequence; and the first color light, the second color light, and the third color light are different colors.

8. The display panel according to claim 1, wherein the curved display regions are located at opposite two sides of the flat display region, and each of the curved display regions is bent in a direction away from a display direction of the display panel.

9. The display panel according to claim 1, wherein a thickness of the absorption layer ranges from 0.01 μm to 10 μm.

10. A display panel comprising a flat display region and a curved display region located on at least one side of the flat display region, wherein the display panel further comprises:
   an array substrate;
   a pixel definition layer disposed on the array substrate, wherein the pixel definition layer defines a plurality of pixel definition openings;
   an organic light-emitting layer disposed in the pixel definition opening and configured to emit various color lights;
   a cathode layer disposed on the pixel definition layer and the organic light-emitting layer;
   an encapsulation layer disposed on the cathode layer; and
   an absorption layer disposed on one side of the pixel definition layer away from the array substrate, wherein the absorption layer is disposed corresponding to at least a portion of the pixel definition layer in the curved display region for selectively absorbing at least one color light emitted by the organic light emitting layer disposed in the curved display region,
   wherein the plurality of color lights emitted by the organic light emitting layer at least comprise a first color light, a second color light, and a third color light in a vertical viewing angle, a brightness ratio of the first color light in the flat display region to the first color light in the curved display region is greater than a brightness ratio of the second color light in the flat display region to the second color light in the curved display region, and the brightness ratio of the second color light in the flat display region to the second color light in the curved display region is equal to a brightness ratio of the third color light in the flat display region to the third color light in the curved display region; and the absorption layer absorbs at least a portion of the first color light.

11. The display panel according to claim 10, wherein the absorption layer is disposed between the pixel definition layer and the cathode layer.

12. The display panel according to claim 10, wherein the absorption layer is disposed between the cathode layer and the encapsulation layer.

13. The display panel according to claim 10, wherein the absorption layer is disposed on the encapsulation layer.

14. The display panel according to claim 10, wherein the encapsulation layer comprises a first inorganic encapsulation layer, an organic encapsulation layer, and a second inorganic encapsulation layer sequentially stacked on the cathode layer, and the absorption layer is disposed inside the encapsulation layer.

15. The display panel according to claim 14, wherein the absorption layer is arranged between the first inorganic encapsulation layer and the organic encapsulation layer.

16. The display panel according to claim 14, wherein the absorption layer is arranged between the organic encapsulation layer and the second inorganic encapsulation layer.

17. The display panel according to claim 10, wherein the first color light, the second color light, and the third color light are red light, green light, and blue light in any sequence; and the first color light, the second color light, and the third color light are different colors.

18. A display device, comprising the display panel of claim 10.

* * * * *